United States Patent [19]
Attaway et al.

[11] Patent Number: 5,872,793
[45] Date of Patent: *Feb. 16, 1999

[54] FAST BIST ARCHITECTURE WITH FLEXIBLE STANDARD INTERFACE

[75] Inventors: Brett W. Attaway; John D. Lofgren, both of Orlando; H. Ray Kelley, Oviedo, all of Fla.

[73] Assignee: Lockheed Martin Corporation, Bethesda, Md.

[ * ] Notice: The term of this patent shall not extend beyond the expiration date of Pat. No. 5,701,308.

[21] Appl. No.: 915,632

[22] Filed: Aug. 21, 1997

Related U.S. Application Data

[63] Continuation of Ser. No. 739,426, Oct. 29, 1996, Pat. No. 5,701,308.

[51] Int. Cl.[6] .................................................. G06F 11/00
[52] U.S. Cl. ............................................................. 371/22.31
[58] Field of Search ............................ 371/22.31, 22.1, 371/22.5; 395/183.06; 324/158 R

[56] References Cited

U.S. PATENT DOCUMENTS

| | | |
|---|---|---|
| 4,433,413 | 2/1984 | Fasang . |
| 4,701,920 | 10/1987 | Resnick et al. . |
| 4,724,380 | 2/1988 | Burrows et al. . |
| 5,051,996 | 9/1991 | Bergeson et al. . |
| 5,138,619 | 8/1992 | Fasang et al. . |
| 5,164,665 | 11/1992 | Yamashita et al. . |
| 5,184,067 | 2/1993 | Nozuyama . |
| 5,230,000 | 7/1993 | Mozingo et al. . |
| 5,258,985 | 11/1993 | Spence et al. . |
| 5,301,199 | 4/1994 | Ikegana et al. . |
| 5,355,369 | 10/1994 | Greenberger et al. . |

OTHER PUBLICATIONS

IEEE Standard Test Access Port and Boundary–Scan Architecture–IEEE Std 1149.1–1990, IEEE Computer Society, Oct. 21, 1993, (complete original booklet).

Supplement to IEEE Std 1149.1–1990, IEEE Standard Test Access Port and Boundary–Scan Architecture, IEEE Computer Society, Mar. 1, 1995, (complete original booklet).

*Primary Examiner*—Vincent P. Canney
*Attorney, Agent, or Firm*—Burns, Doane, Swecker & Mathis, L.L.P.

[57] ABSTRACT

A built-in self test architecture for testing one or more integrated circuits. Each circuit is provided with an interface compatible with IEEE standard 1149.1 and one or more scan registers containing scan cells for supplying input test data to, and receiving output test data from, the internal circuitry of the integrated circuits, a pseudo-random pattern generator for supplying patterns of test data to the boundary scan register, and a pattern compressor for compressing the output test data into a signature. The architecture also includes a single clock multiplexer, located external to the integrated circuits, for selectively supplying a system clock or a test clock to the testing components of each integrated circuit.

15 Claims, 5 Drawing Sheets

FAST BIST ARCHITECTURE WITH FLEXIBLE STANDARD INTERFACE

This application is a continuation, of application Ser. No. 08/739,426, filed Oct. 29, 1996.

FIELD OF THE INVENTION

The present invention is generally directed toward the testing of integrated circuits; more particularly, the present invention is directed toward a built-in test architecture for an integrated circuit.

BACKGROUND OF THE INVENTION

As the degree of integration of VLSI circuits continues to increase, there exists a correspondingly increasing need for fast and reliable methods for testing such circuits. It has been estimated that costs associated with integrated circuit chip testing increase in proportion to the square of the number of devices on the chip. Accordingly, an easily-implemented, fast, and reliable chip testing method is needed.

A known and commonly used technique for testing integrated circuit chips is the boundary scan method, in which a boundary-scan cell is provided adjacent to each pin of an integrated circuit. A boundary scan cell typically includes one or more flip-flops and allows input test data to be supplied to, or output test data to be sampled from, the integrated circuit. The boundary scan cells for each pin of a chip (or from each pin of a plurality of interconnected chips) are connected to form one or more shift registers. FIG. 1 shows an exemplary boundary scan cell. The boundary scan cell includes multiplexers 2 and 4, and flip-flop elements 6 and 8. Data, in the form of test data or instructions, is input to the first inputs of multiplexers 2 and 4 on line NDI, while the output of a previous boundary scan cell is input to the second input of multiplexer 2 on line SDI. The output of multiplexer 2 is determined by a control signal on line SHIFT/LOAD, and the output of multiplexer 4 is determined by a control signal on line MODE. When a LOAD signal is input to multiplexer 2 on line SHIFT/LOAD, flip-flop 6 samples the data on line NDI. When a SHIFT signal is input to multiplexer 2 on line SHIFT/LOAD, the flip-flop 6 samples the output of the previous scan cell. The data sampled by flip-flop 6 may be serially passed through to a successive boundary scan cell via scan data out line SDO, or may be supplied to flip-flop 8. Flip-flop 8 is an intermediate storage element which samples and stores a value for use in a future test. Multiplexer 4 receives normal data on line NDI at one input, and receives test data stored in flip-flop 8 at a second input. Multiplexer 4 outputs data on line NDO under the control of the MODE signal. Thus, if scan cells are each connected to respective data pins of an integrated circuit, test data stored in the flip-flop 8 of each scan cell can be supplied to the data pins under the control of the MODE signal. Flip-flops 6 and 8 operate according to separate clock signals A and B to enable flip-flop 8 to source the output of the boundary scan cell while new data is input to flip-flop 6.

Referring now to FIG. 2, an arrangement of boundary scan cells around a group of interconnected integrated circuits on a circuit board is shown. Collectively, the boundary scan cells around each integrated circuit form a shift register. This arrangement allows the interconnections between the circuit components in each of the integrated circuits to be tested by shifting test data into all of the boundary scan cells associated with integrated circuit output pins and loading input test data in parallel through the component interconnections into the cells associated with integrated circuit input pins. This arrangement also allows the integrated circuits on the circuit board to be tested by isolating the internal logic circuitry of each chip from the surrounding circuit elements while an internal self-test is performed. The boundary scan cell method also permits a limited slow-speed static test of the internal logic circuitry of a chip by allowing test data to be input to the chip and the chip output data analyzed. Because the boundary scan register permits parallel loading of cells at both the input and output pins of an integrated circuit and permits the shifting out of the results, the register effectively samples data flowing through a component without interfering with the operation of the component. While boundary scan cells offer numerous benefits, a functional test of the operation of the complete system of interconnected integrated circuits requires separate automatic test equipment (ATE) or a system-level self test.

Additionally, thorough testing of the internal functions of each integrated circuit is typically not feasible using only this test technique.

A built-in self test (BIST) architecture typically includes a pattern or operand generator for producing test operands, each of which is applied to the internal logic circuitry of the integrated circuit. The results of each test operand are compressed into a "signature" which is compared to predetermined signatures to detect faults. BIST architecture is advantageous because the test circuitry is fabricated on the chip with the main logic functions, while having a minimal impact on the main logic functions. Further, since the test results are processed by BIST circuitry, the number of tasks which must be performed by external components is reduced, and maintenance software is simplified. BIST also allows for testing at full system clock rates, significantly reducing test time. BIST further allows for testing any number of different types of circuits, independent of specific chip logic functions, at the wafer, chip, or system levels, both before and after assembly into a computer.

However, known BIST architectures have limitations. In particular, BIST architectures require a means for selecting a system clock for normal operations and a test clock for test operations. In typical BIST architectures, a clock multiplexer is provided in each integrated circuit having a BIST capability. Examples of such architectures include U.S. Pat. No. 4,701,920 to Resnick et al. and U.S. Pat. No. 5,138,619 to Fasang et al. In such an arrangement, there are significant and variable delays in the clock distribution circuitry. Because different clock multiplexers are used for each integrated circuit in a system, the clock signals supplied to the different circuits may have varying phases (skew). Further, many known BIST architectures include customized interfaces, which often require an increase in the number of input or output pins needed to fabricate the integrated circuit.

It would be advantageous for a BIST architecture to include an industry standardized, low pin-count interface. It would also be advantageous for a BIST architecture to allow the testing using either known, externally supplied test data or pseudo-random test data patterns generated on the chip. It would further be advantageous for a BIST architecture to eliminate the need for an on-chip clock multiplexer to allow the main integrated circuits to operate at a high speed, while allowing the test circuitry to operate at a lower speed, and avoiding significant and variable clock delays and skews.

SUMMARY OF THE INVENTION

To overcome the above limitations of known BIST architectures, and to provide other benefits, the present invention provides for a fast BIST architecture which incorporates a standard, low pin-count interface, a single external clock multiplexer for testing multiple integrated circuits, and which allows testing to be performed using either internally or externally generated test data. According to the invention, a BIST circuit is capable of both boundary scan testing as well as internal scan testing of the internal logic circuitry of the integrated circuit. In one aspect, the BIST architecture according to the present invention may include a built-in pseudo-random pattern generator for generating test data patterns for input into one or more boundary scan registers or one or more internal scan registers. A testing operation may be performed using either the internally-generated pseudo-random test data or test data supplied from an external source.

A testing operation may be initiated by a control signal from an external controller. The control signal is received by an interface on the integrated circuit, which generates instructions in response to the control signal. The instructions generated by the control signal are decoded and used to control the scan cells of the boundary scan registers and internal scan registers, which sample and shift test data according to a test clock signal.

Output test data may be compressed in a signature compression means to form a data signature which is compared to a predetermined signature to detect faults. It is presently preferred that the interface be compatible with IEEE standard 1149.1.

According to another aspect of the invention, a single external clock multiplexer is provided for selectively interrupting the supply of the system clock signal to all of the integrated circuits to be tested during the sampling and shifting of data. The clock multiplexer enables the internal circuitry of the integrated circuit to generate output test data from the input test data stored in the scan registers using the system clock, and enables the sampling and shifting of data to be performed using the test clock. Input test data can be loaded into the scan registers, shifted within the scan registers, or output by the scan registers while the system clock is interrupted. By providing a single clock multiplexer external to the integrated circuits to be tested, the present invention eliminates the clock skew problems present in systems having one or more clock multiplexers for each integrated circuit.

DETAILED DESCRIPTION OF THE PREFERRED EMBODIMENTS

Figure 3A:
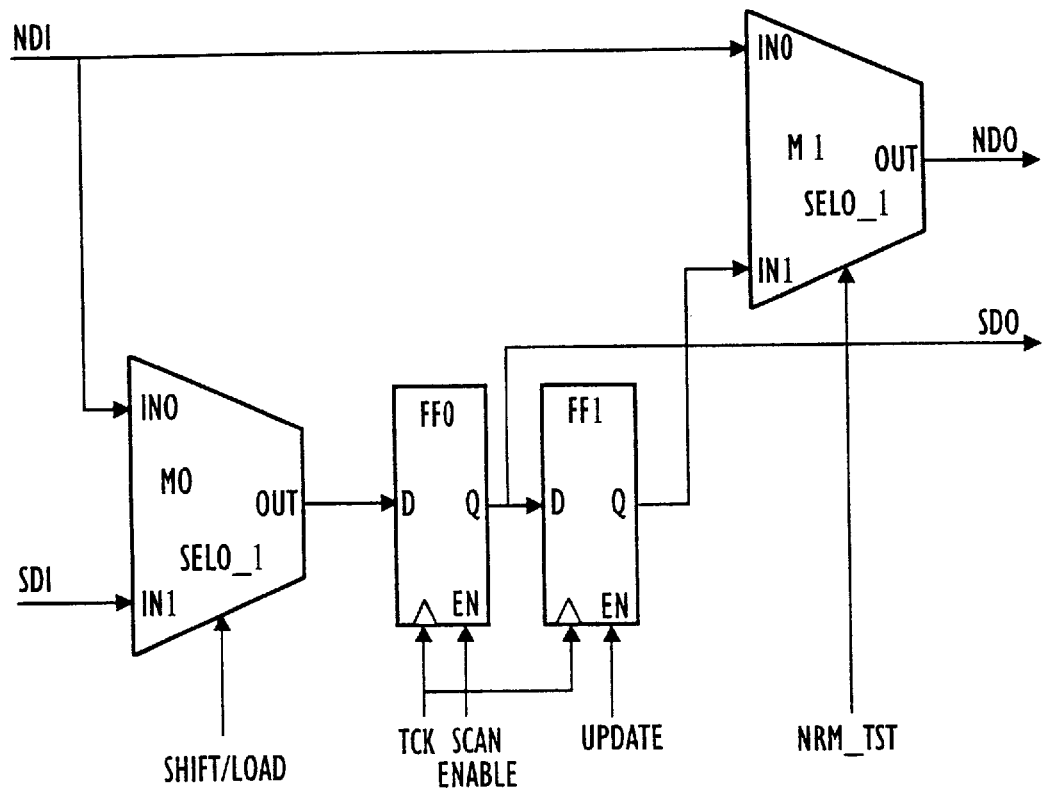
FIG. 3A is a block diagram of a boundary scan cell suitable for use in the present invention.
Figure 3B:
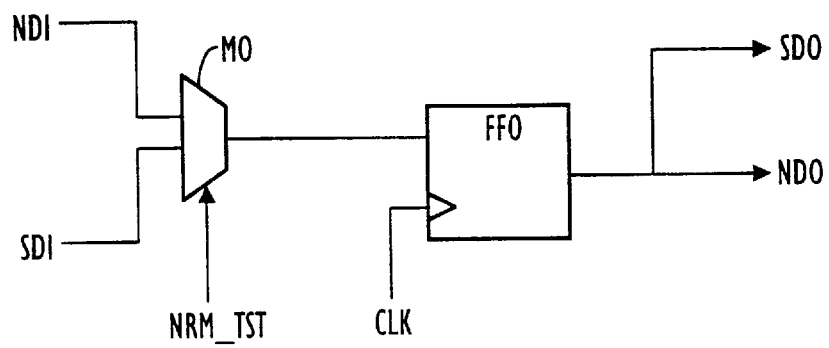
FIG. 3B is a block diagram of an internal scan cell suitable for use in the present invention.

Referring now to FIG. 3A, a scan cell suitable for use in the present invention is shown. For a boundary scan test, the cell may be connected to an input pin or an output pin of an integrated circuit. In the case where the cell is connected to an input pin, input data from an external source is received on normal data in line NDI, and data is output from multiplexer M1 as input data to the integrated circuit pin on normal data out line NDO. In the case where the cell is connected to an output pin of the integrated circuit, output data from the output pin is received on normal data in line NDI, and data is output to a connection line (not shown) associated with the output pin on normal data out line NDO. Alternatively, a scan cell for performing a scan test of internal circuitry is shown in FIG. 3B. Such an internal scan cell includes a single multiplexer M0 which receives data from the internal logic circuitry of the integrated circuit on line NDI. The multiplexer M0 is controlled by normal/test select signal NRM_TST, and selectively provides the data present on line NDI or the data sampled by previous stage flip-flop FF0 as output data on line NDO. In the circuit of FIG. 3B, the flip-flop FF0 can be implemented by a component of the internal logic circuitry of the integrated circuit. Further, as shown in FIG. 3B, the flip-flop FF0 samples data according to a system clock signal CLK.

Figure 1:
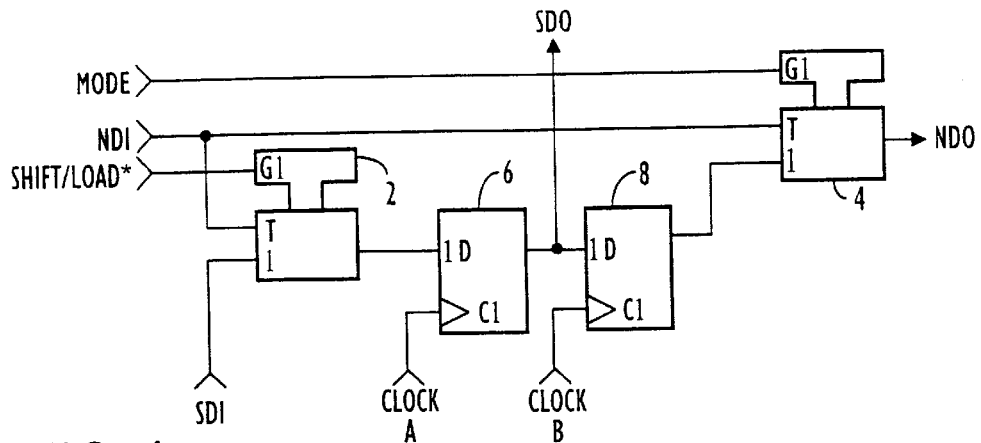
FIG. 1 is a block diagram of a standard boundary scan cell known in the art.

As shown in FIG. 3A, each boundary scan cell preferably includes a multiplexer M1, which is controlled by normal/test select signal NRM_TST and which selectively provides the data present on line NDI or the data sampled by flip-flop FF1 as output data on line NDO. The cell also includes multiplexer M0 which is controlled by shift/load signal SHIFT/LOAD, and which selectively provides the data present on line NDI or the data present on scan data in line SDI to be sampled by flip-flop FF0. The output of flip-flop FF0 is supplied to scan data out line SDO, and also as the input to flip-flop FF1. As described with respect to FIG. 1, the boundary scan cell receives data sampled by the flip-flop FF1 of a previous scan cell on line SDI, and outputs data to the multiplexer M0 of a successive scan cell on line SDO. The flip-flops FF0 and FF1 shown in FIG. 3A sample data output by multiplexer M0 according to a test clock signal TCK.

The operation of each boundary scan cell in FIG. 3A is controlled by control signals SHIFT/LOAD, SCAN ENABLE, UPDATE, and NRM_TST, which are supplied by an interface element of the integrated circuit in a manner to be described below. During normal operation of the integrated circuit, the control signals cause the multiplexer M1 to provide the data on normal data in line NDI to normal data out line NDO. During a boundary scan test operation, input test data can be provided to input data pins via lines NDI and NDO. The input test data can be sampled by flip-flop FF0 based on the states of control signals SHIFT/LOAD and SCAN ENABLE. Data sampled by flip-flop FF0 can be sampled by flip-flop FF1 or shifted to a successive boundary cell based on the states of control signals SCAN ENABLE and UPDATE. Data sampled by flip-flop FF1 can be output on normal data out line NDO to the input pins of the integrated circuit based on the states of control signals UPDATE and NRM_TST. Boundary cells connected to output pins of the integrated circuit may be controlled in a similar manner to output sample or shift output test data. In order to simplify the discussion, it will be appreciated that the terms "shift" and "shifting" are used herein to refer to the operation of shifting data between the cells of the scan registers or the operation of outputting data from the scan cells.

As described above, the scan cells are connected together to form a shift register. To perform a test operation, the scan cells associated with input pins or inputs to internal circuitry of the integrated circuit are serially loaded with test data received on normal data in line NDI, the internal circuitry of the integrated circuit operates for a predetermined time, and the output data is sampled by the scan cells. After a test operation is performed, the output test data is shifted out while a new vector of test data is loaded into the shift register. The term "vector" is used herein to describe one set or pattern of input test data to be supplied to an integrated circuit for a test operation.

Figure 4:
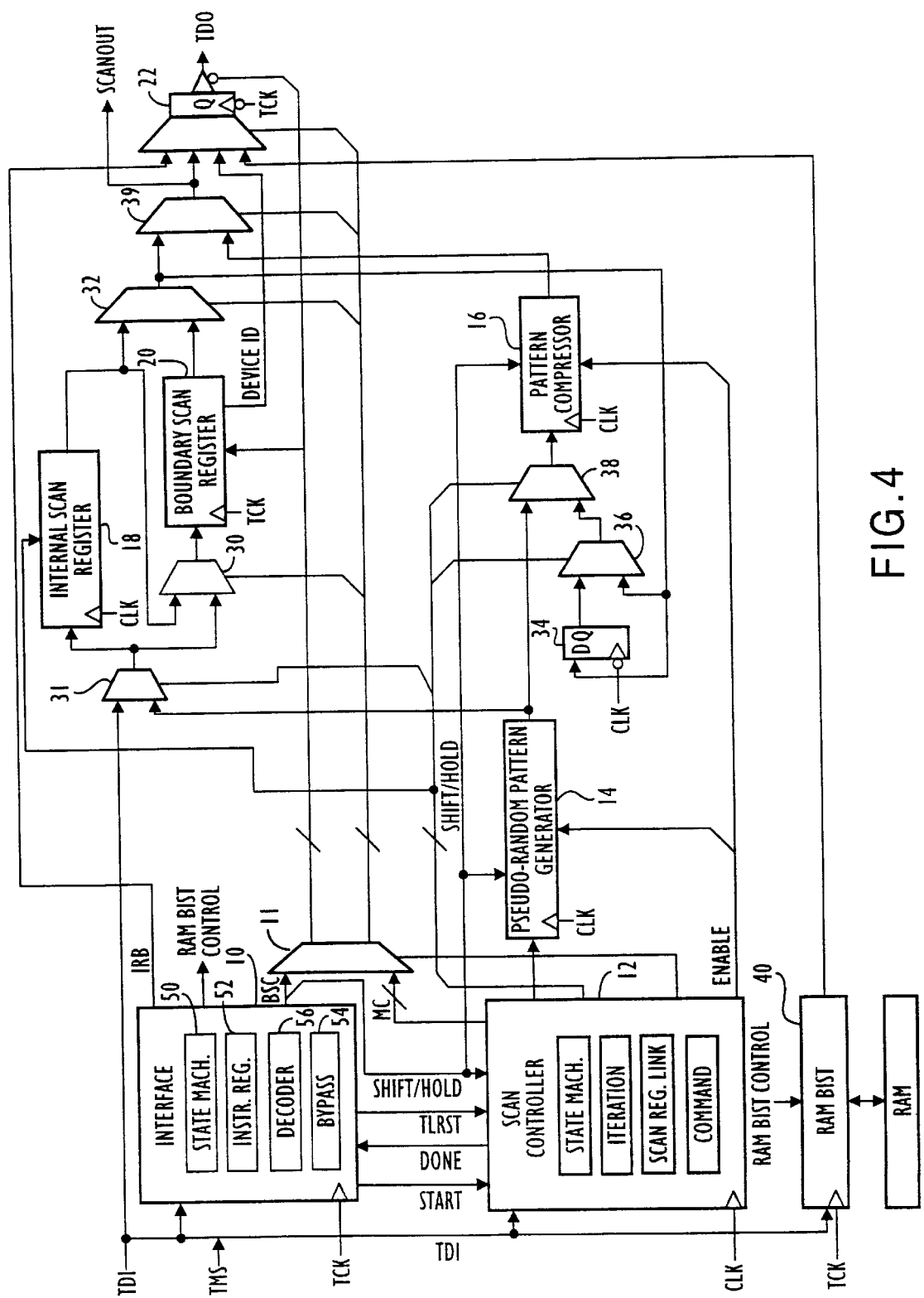
FIG. 4 is a block diagram of an integrated circuit having a Built-In Self Test (BIST) architecture according to the present invention.

Referring now to FIG. 4, a BIST architecture with flexible standard interface according to a presently preferred embodiment of the present invention is shown. The BIST system includes an interface 10, a test controller 12, a pseudo-random pattern generator 14, a pattern compressor 16, an internal scan register 18, a boundary scan register 20, and an output multiplexer 22. The interface 10 is a test access port (TAP) interface, which is preferably compatible with IEEE standard 1149.1. As will be appreciated by those of ordinary skill in the art, IEEE standard 1149.1 is a test access port and boundary scan architecture standard published by the Institute for Electrical and Electronic Engineers (IEEE), and defines circuitry that may be built into an integrated circuit to assist in the test, maintenance, and support of assembled printed circuit boards. A written description of the standard is available from IEEE ("IEEE Standard Test Access Port and Boundary-Scan Architecture", Std 1149.1-1990), and is incorporated herein by reference. The interface 10 receives, from an external TAP control device (not shown), test data and instructions on line TDI, a test mode select signal on line TMS, and a test clock signal on line TCK. The TAP control device is an external element which may be a microprocessor or other suitable test control equipment known in the art. Interface 10 includes a state machine which generates instructions in response to the test mode select signal on line TMS. The state machine controls the test operation, and will be described in more detail below. Interface 10 also includes an instruction register for storing instructions generated by the state machine, an instruction register decoder for decoding the instructions, and a bypass register for bypassing the internal logic circuitry of the integrated circuit. Interface 10 outputs a scan test start signal on line START, a reset control signal on line TLRST, boundary scan control signals on lines BSC (which include the SHIFT/HOLD, SCAN ENABLE, UPDATE, and NRM_TST signals used to control the scan cells as shown in FIG. 3), and instruction register and bypass signals on lines IRB.

Scan controller 12 receives the signals on lines START, TLRST, and SHIFT/HOLD from interface 10, receives input test data and instructions on line TDI from the external TAP control device, and receives a system clock signal from an external source on line CLK. Scan controller 12 includes a scan register length counter, an iteration counter, a state machine, and a command register. The iteration counter has a count value which represents the number of test vectors to be used to test the integrated circuit, and the scan register length counter has a count value which represents the number of elements (i.e., cells or stages) in the scan register to be selected for a given test operation. The count values of the scan register length counter and iteration counter may be fixed or programmable via data on line TDI; however, it will be appreciated that programmable count values allow greater flexibility in that separate tests using multiple scan registers or a single test using a single unified scan register can be readily performed. The counters are reset at the start of a scan test operation by a control signal on line TLRST, and the scan test operation terminates when both counters reach their terminal count values. The state machine included in scan controller 12 is a four-state state machine for controlling the scan test operation. The command register is a multiple bit register for storing commands. In the preferred embodiment, the command register is an eight-bit register, and each bit controls one of the group of multiplexers as shown in FIG. 4 on multiplexer control line MC to control the operation of the system. The control signals on lines BSC and MC are supplied as inputs to multiplexer 11, which is controlled by a separate multiplexer control signal supplied from scan controller 12.

A scan test operation is initiated by a scan test start signal received by the scan controller 12 from interface 10 on line START, and when the scan test operation is completed (i.e., when the scan register length counter and iteration counter reach their terminal count values), the scan controller 12 informs interface 10 via a status bit on line DONE. To perform the scan test operation, test data is supplied to internal scan register 18 and boundary scan register 20 from either test data in line TDI or from pattern generator 14, depending upon the state of the control signal input to multiplexer 31. Multiplexer 31 thus enables the integrated circuit to be tested using test data generated by the external TAP control device, which typically includes predetermined data patterns, or pseudo-random test data generated by pattern generator 14. When it is desired to supply pseudo-random test data to the test circuitry, scan controller 12 causes pattern generator 14 to generate the pseudo-random test signal patterns, and generates the control signal to cause multiplexer 31 to supply the pseudo-random test signal patterns to scan registers 18 and/or 20. When it is desired to supply known or predetermined test signal patterns to the test circuitry, scan controller 12 causes multiplexer 31 to supply data on line TDI to the scan registers 18 and/or 20. It will be appreciated that a scan test may be performed using one or more boundary scan registers 20, one or more internal scan registers 18, or a concatenation of internal scan register 18 and boundary scan register 20.

During a scan test operation, the scan cells of the selected scan chain or chains associated with input pins or input internal circuitry elements are serially loaded with input test data from either test data in line TDI or pattern generator 14 on the normal data in line NDI of the scan cell. The loading of the boundary scan cells is performed according to the test clock TCK, while the loading of the internal scan cells is performed according to the system clock CLK. The input test data is then supplied in parallel to the internal circuitry for a predetermined time (e.g., one system clock pulse), and the output test data is sampled by the cells of the selected scan chain or chains associated with output pins or output elements of the internal circuitry. The output test data is shifted out while a new vector of input test data is loaded into the selected scan chain or chains. The shifting of the output test data is performed according to the test clock TCK for the boundary scan register, and according to the system clock CLK for the internal scan register. The output test data is supplied to pattern compressor 16, which compresses the output test data into a signature for comparison with a predetermined signature to determine if any faults are present in the tested circuitry. The comparison function may be performed by pattern compressor 16 or by a separate signature comparator or comparison element located on the integrated circuit or located external to all of the integrated circuits.

Pattern generator 14 generates pseudo-random test data patterns for input to the scan registers 18 and 20. Pattern generator 14 is preferably a programmable type-2 linear feedback shift register (LFSR), which has a coefficient register and a seed. As will be appreciated by those of ordinary skill in the art, a linear feedback shift register may be characterized as a non-sequential repeating counter in which a coefficient register value determines the feedback characteristics of the register and the seed value determines the patterns which will be generated by the register. The seed value and coefficient register value may be programmable by the scan controller 12 using data supplied on test data-in line TDI, or may have fixed values. Pattern generator 14 operates according to the system clock CLK.

Pattern compressor 16 is, like the pattern generator 14, preferably a programmable type-2 linear feedback register having a seed and coefficient register which may be programmable or fixed. The output test data of the selected scan chain is input to pattern compressor 16. Pattern compressor 16 generates a unique signature based on the serial data pattern received from the selected scan chain, the coefficient, and the starting seed value. Pattern compressor 16 operates according to system clock CLK.

It will be appreciated that scan controller 12, pattern generator 14, and pattern compressor 14 may be implemented as a single data register which may be loaded by the interface 10 or by data on line TDI.

Internal scan register 18 is comprised of flip-flops in the existing logic circuitry of the integrated circuit. Preferably, the flip-flops in the internal integrated circuitry have a 2:1 multiplex ratio in which a first input is a normal functional signal (i.e., a test signal or data signal), a second input is from a prior internal scan chain element, and the multiplexer select input is controlled by scan controller 12 using the control signals SHIFT/LOAD, SCAN ENABLE, UPDATE, and NRM_TST. To obtain maximum fault detection coverage, it is desirable to connect every flip-flop within the logic circuitry of the integrated circuit to an internal scan chain. Just as for boundary scan chains, there may be a single, lengthy internal scan chain or there may be multiple internal scan chains. It will be appreciated that if there are multiple scan chains, there will be more output lines to be multiplexed for input to output multiplexer 22, and additional multiplexer control bits will be required for the command register of controller 12. As shown in FIG. 4, the internal scan register 18 operates according to system clock signal CLK.

Figure 2:
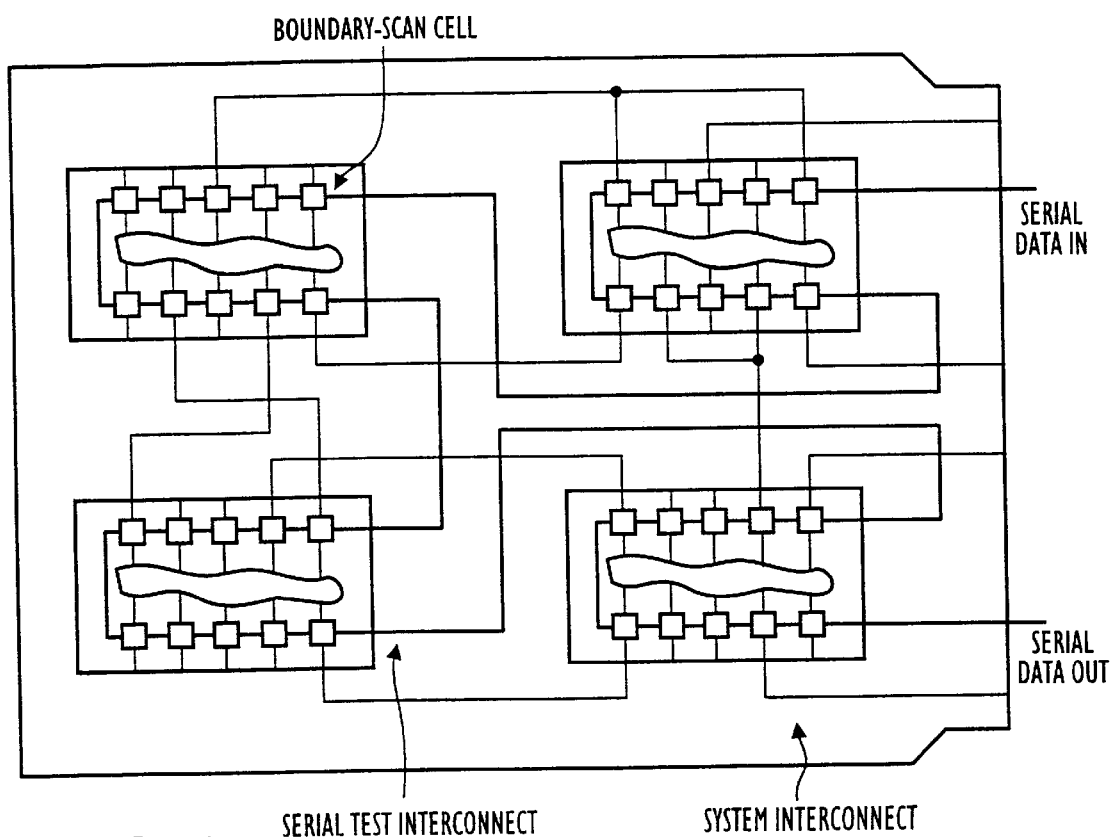
FIG. 2 shows a standard boundary scan test arrangement known in the art for a circuit board containing multiple integrated circuits.

Boundary scan register 20 is comprised of boundary scan cells, such as those shown in FIG. 3, which are connected in the manner shown in FIG. 2. As shown in FIG. 4, the boundary scan register 20 operates according to test clock TCK. The individual boundary scan cells are controlled by the signals SHIFT/LOAD, SCAN ENABLE, UPDATE, and NRM_TST on lines BSC. It will be appreciated that, to maximize fault detection capabilities, both the boundary scan register 20 and the internal scan register 18 can be selected for testing by controller 12. When both the boundary scan register 20 and the internal scan register 18 are selected, they are concatenated together through multiplexer 30 to form the equivalent of a single register. To ensure that the data in the final cell of internal scan register 18 is successfully shifted into the first cell of boundary scan register 20, the concatenated registers should be clocked by the same clock signal, preferably test clock TCK.

Boundary scan register 20, in addition to supplying and receiving responses to input test data, may also be configured to provide a device identification function. In such a configuration, the last cells of the boundary scan register provide a dual function of either storing the device ID or storing normal scan register information. This implementation is possible because there is never a case in which both scan data and device identification information will be required simultaneously. Alternatively, a separate device ID resister may be provided; however, the use of dual function boundary scan cells reduces the number of gates required to implement the device identification function. As shown in FIG. 4, the device ID is provided as an input to output multiplexer 22 on line DEVICE ID.

The output test data from internal scan register 18 and boundary scan register 20 are supplied as separate inputs or as a single input to multiplexer 32, the output of which is determined by one of the bits in the command register of controller 12. The output of multiplexer 32 sampled by D-type flip-flop 34 on a pulse of system clock CLK, and is provided to pattern compressor 16 through multiplexers 36 and 38. As stated above, pattern compressor 16 compresses the outputs of internal scan register 18 and boundary scan register 20 to form a unique signature. The output of multiplexer 32 and the signature output of pattern compressor 16 are both provided as inputs to multiplexer 39, the output of which is determined by a command register bit from controller 12. The output of multiplexer 39 is supplied as one input to output multiplexer 22. As described above, the multiplexers are controlled by individual bits of the command register contained in scan controller 12.

The present invention may be implemented in conjunction with a RAM BIST circuit, which is well-known in the art. In such an embodiment, test data or instructions on line TDI interface 10 can provide a RAM BIST control signal to control the operation of RAM BIST circuit. As shown in FIG. 4, the RAM BIST circuit receives the test clock signal on line TCK and the test data or instructions on line TDI, and provides an output signal to output multiplexer 22.

Output multiplexer 22 may receive inputs from the following sources: the instruction register and bypass register contained within interface 10 on lines IRB, boundary scan register 20, device identification line DEVICE ID, RAM BIST element 40, internal scan register 18, and a pattern compressor 16. The specific inputs received by output multiplexer 22 and the output signal provided by output multiplexer 22 are determined by the control signals on lines BSC and MC. Output multiplexer 22 is clocked according to test clock TCK.

The output of multiplexer 22 on line TDO is present only during an active access operation to interface 10. Since interface 10 is not typically accessed during a test operation, line TDO will not be driven during a test operation. Since it may be desirable to view the output test data during a test session, there is provided a SCANOUT output from multiplexer 38. The SCANOUT output enables signature comparison to be performed by a comparator located external to the integrated circuits.

Figure 5:
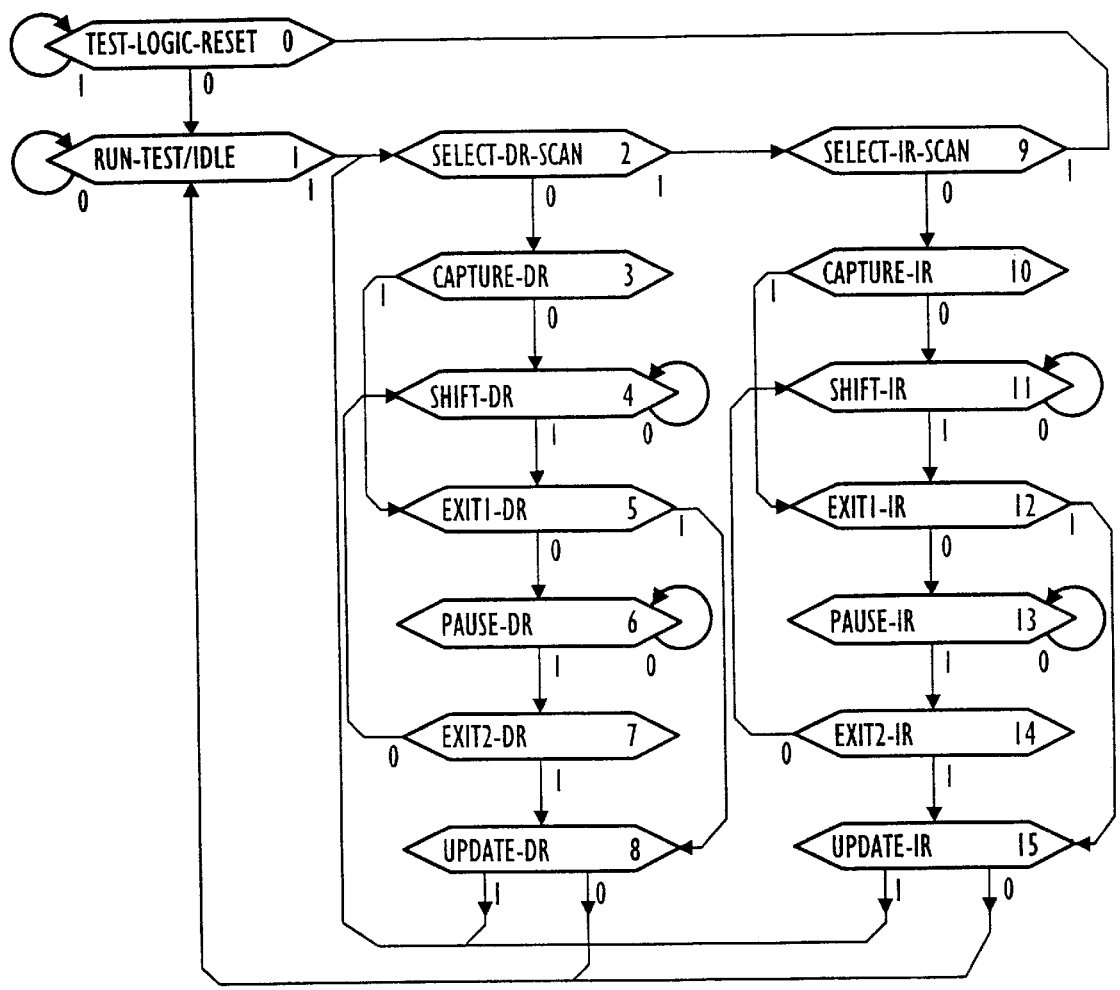
FIG. 5 is a state diagram for the state machine used in the Interface of the BIST architecture of FIG. 4.

Referring now to FIG. 5, an exemplary state transition diagram for the state machine 50 contained in interface 10 is shown. In the figure, the annotations next to the flow arrows indicate the value of the test mode select signal on line TMS. As shown, an initial test logic or reset state 0 may be achieved by holding the test mode select signal high for a minimum of five cycles of test clock TCK. From state 0, if the test mode select signal is maintained high, the state machine will idle at state 0, and if the test mode select signal goes low, the state machine enters a Run-Test/Idle state 1, in which built-in test routines may be executed. If no built-in test routines are available, then state 1 is a null state. From state 1, the test mode select signal can be used to force a transition into data register scan state 2, from which data in the scan elements comprising either the internal scan register 18 or boundary scan register 20 can be captured, shifted, paused, or shifted to the secondary flip-flops in each cell (updated) in states 2–8. Alternatively, the test mode select signal can be used to enter an instruction register manipulation path comprised of states 9–15 to manipulate data in the instruction register of interface 10. In states 9–15, boundary scan status (which may be, for example, a current instruction or a flag indicating the result of a completed test) can be captured in state 10, a new boundary scan instruction may be loaded in state 15, or the instruction register data can be shifted, paused, or unaffected in states 11–14. It will be appreciated that the state diagram of FIG. 5 is merely exemplary, and that many other state transition schemes may be implemented in the BIST architecture according to the present invention. In particular, the IEEE standard 1149.1 reference described above suggests an alternative state transition scheme which may allow a reduced gate count.

Referring once again to FIG. 4, interface 10 includes state machine 50, which receives test mode select line TMS, test reset line TRST, and test clock line TCK. State machine 50 outputs data manipulation signals to instruction register 52 and to the scan registers 18 and 20 as described above with respect to FIG. 5. The data manipulation signals control the scan paths, which include the paths associated with the bypass register 54, internal scan registers 18, boundary scan register 20, and instruction register 52. Bypass register 54 is a single flip-flop register which provides a direct, synchronized conduit through the integrated circuit when no interaction with the integrated circuit is desired. Test data is input through line TDI to the SDI (scan data in, see FIG. 3) input of the first boundary scan cell in each scan path. The SDO (scan data out, see FIG. 3) signal from the last scan cell of each scan path register is connected to the multiplexers that lead to output multiplexer 22 and test data out line TDO.

Instruction register 52 stores instructions from state machine 50 and determines the test to be performed or the test data register for future data scan operations. The instructions stored in instruction register 52 are decoded by instruction decoder 56 for execution by the elements receiving boundary scan control signals on line BSC. That is, the decoded instructions cause appropriate signals to be applied to lines SHIFT/HOLD, SCAN ENABLE, UPDATE, and NRM_TST of control lines BSC to control the operation of the scan cells as shown in FIG. 3. All instructions are executed during the Run-Test Idle state 1 of the state machine 50. IEEE standard 1149.1 provides for BYPASS, SAMPLE/PRELOAD, and EXTEST instructions. The BYPASS instruction is implemented when instruction register 52 contains all 1's, and causes all future data transfers to pass through the single flip-flop bypass register 54. This instruction allows the test programmer to quickly move input test data sets through devices which are not relevant to the test. The SAMPLE/PRELOAD instruction is implemented by a user-defined code and causes current integrated circuit data to be sampled on the rising edge of test clock TCK during capture state 3 of state machine 50. This instruction also causes data in each scan register to be transferred to the secondary flip-flop of each register cell on the falling edge of test clock TCK during the update state 8 of state machine 50. The EXTEST instruction is implemented when the instruction register contains all 0's, and causes data in the boundary scan register to be driven on the integrated circuit output pin on the falling edge of test clock TCK during the update state 8 of state machine 50. This instruction also causes all data on the integrated circuit input pins to be sampled on the rising edge of test clock TCK during capture state 3 of state machine 50.

IEEE standard 1149.1 also recommends implementation of INTEST and RUNBIST instructions. INTEST causes all inputs to the chip and all outputs driven off the chip to be captured, and substitutes the boundary scan data for the system data on all outputs. RUNBIST causes the chip to perform a self-test operation. It will be appreciated that the instruction register codes for implementing these instructions, as well as for the BYPASS, SAMPLE/PRELOAD, and EXTEST instructions may be defined by the user.

Figure 6:
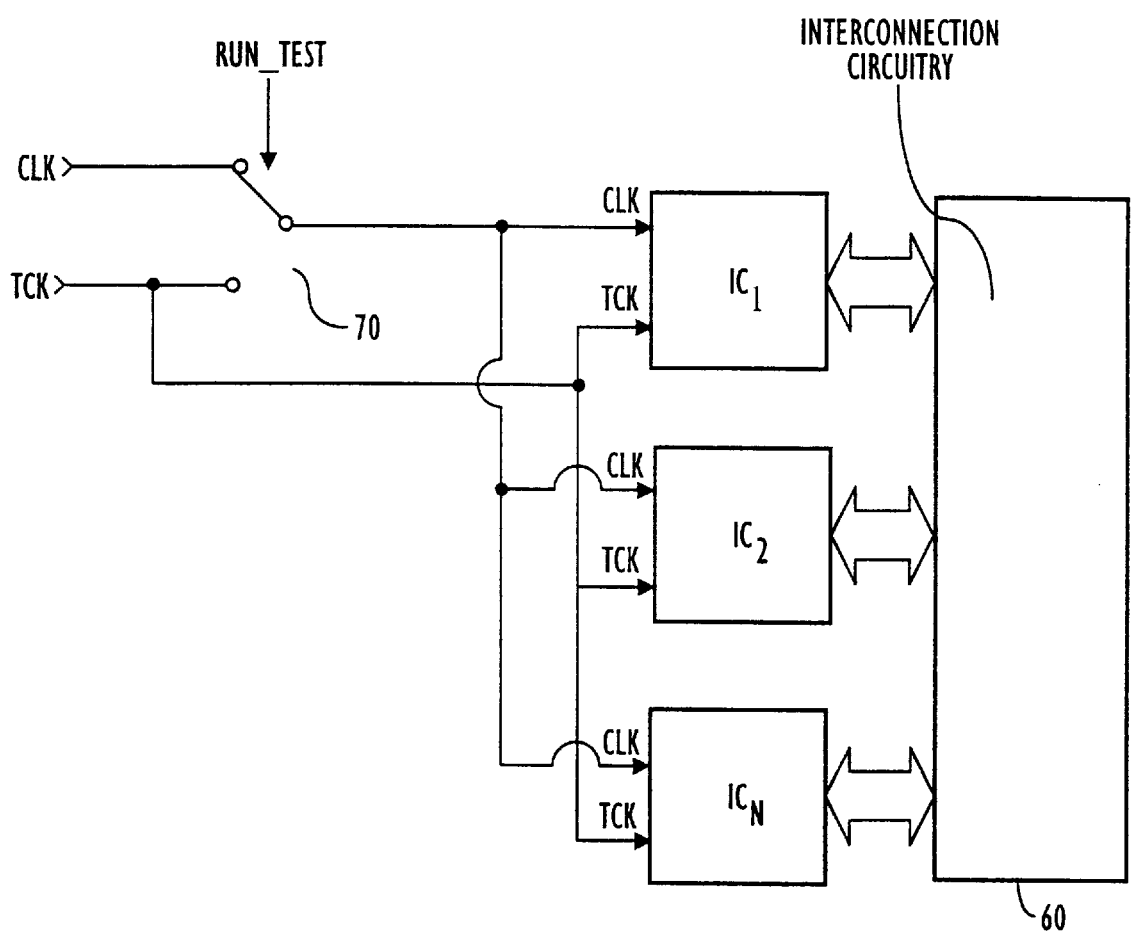
FIG. 6 shows a test arrangement for a system containing multiple integrated circuits having a BIST architecture according to the present invention.

Referring now to FIG. 6, the clock control circuitry for supplying clock signals CLK and TCK to a plurality of integrated circuits IC, $IC_2$, . . . $IC_n$ interconnected by interconnection circuits 60 is shown. Each integrated circuit $IC_1$, $IC_2$, . . . $IC_n$ has a BIST architecture according to the present invention as described above. As will be appreciated by those of skill in the art, BIST architectures require a clock multiplexer which allows the test clock or a system clock to be used as the active clock signal. According to the present invention, a clock multiplexer 70 is provided at a location external to all of the integrated circuits to be tested. The multiplexer 70 allows the system clock CLK to be replaced by the test clock TCK on each one of the integrated circuits $IC_1$, $IC_2$, . . . $IC_n$, based on the state of a signal on line RUN_TEST from the external TAP control device (not shown). The operations of loading, shifting, and sampling of test data may be performed according to the test clock. During a test operation, the system clock may be supplied to the circuit or circuits to be tested to enable at-speed internal testing to be performed. By conducting tests according to the faster system clock, several thousand serial pseudo-random test patterns can be used to test the circuits in a relatively short time. After the tests have been completed, and the results compressed into a signature, the signature may be read out through output multiplexer 22 according to the test clock replacing the system clock to the integrated circuits. For normal operation, the system clock is supplied to the integrated circuits through multiplexer 70. Because the clock multiplexer 70 is provided at a point external to the circuits to be tested, the present invention eliminates the need for separate clock multiplexers provided in each device, thereby eliminating the significant and variable clock delays associated with multiple clock multiplexers and enhancing the performance of the functional circuitry. Further, because all of the devices to be tested receive the same clock signal, clock phase delays are transparent to the system.

It is to be understood that the specificities and details contained in the foregoing description of presently-preferred embodiments are included for illustrative purposes only, and should not be construed as limiting the scope of the invention. Many modifications to the examples described above will be apparent to those of ordinary skill in the art. For example, the specific embodiments described above include a number of multiplexers for controlling the operation of the test circuit. It will be appreciated that other control devices may alternatively be used to provide a control function. These and many other modifications may be made to the foregoing embodiments without departing from the spirit and scope of the present invention, as defined by the appended claims and their equivalents.

What is claimed is:

1. A circuit for testing one or more integrated circuits, each integrated circuit having main logic circuitry operating according to a system clock signal, the circuit comprising:

input test data means for supplying input test data to the main logic circuitry;

output test data means for receiving output test data generated by the main logic circuitry in response to the input test data; and external multiplexing means for selectively replacing the system clock signal with a test clock signal such that the input test data is received by the input test data means, and the output test data is shifted to the output test data means, according to the test clock signal while the system clock signal is replaced.

2. The circuit of claim 1, wherein the external multiplexing means includes a clock multiplexer located external to the one or more integrated circuits.

3. The circuit of claim 1, wherein the system clock signal is provided by an external source.

4. The circuit of claim 1, wherein the input test data means and output test data means are implemented using one or more scan registers.

5. The circuit of claim 2, wherein the scan registers receive the input data according to the test clock, supply the input test data to the main logic circuitry, receive the output test data, and shift the output test data according to the test clock signal.

6. A method for testing logic circuitry contained in one or more integrated circuits, the logic circuitry operating according to a system clock signal, comprising the steps of:

supplying input test data to the logic circuitry via scan registers; and outputting output test data generated by the logic circuitry in response to the input test data via the scan registers; and multiplexing, at a source external to the one or more integrated circuits, the system clock signal and a test clock signal such that the scan registers receive the input test data and output the output test data according to the test clock signal.

7. The method of claim 6, wherein the scan registers receive the output test data from the logic circuitry according to the test clock signal.

8. The method of claim 6, further comprising the steps of:

forming a data signature element from the output test data according to the system clock signal;

comparing the data signature with a predetermined signature to generate an output test signal; and outputting the output test signal according to the test clock signal.

9. The method of claim 6, further comprising the step of:

replacing multiple system clocks by the test clock signal from a single test clock.

10. An integrated circuit arrangement, comprising:

main logic circuitry operating according to an interruptable system clock signal;

an input test data source;

boundary testing means for receiving input test data, supplying the input test data to the main logic circuitry, and receiving and storing output test data generated by the main logic circuitry in response to the input test data, the boundary testing means operating according to a test clock during a period in which the system clock signal is interrupted; and internal testing means for receiving input test data, supplying the input test data to the main logic circuitry, and receiving and storing output test data generated by the main logic circuitry in response to the input test data, the internal testing means operating according to the system clock.

11. The arrangement of claim 10, wherein the system clock signal is interrupted and replaced by the test clock at a location external to the integrated circuit.

12. The arrangement of claim 10, further comprising data signature means for forming a data signature from the output test data and comparing the data signature with a predetermined value for determining the presence of faults in the integrated circuit.

13. The arrangement of claim 10, further comprising an interface for receiving a test control signal from an external source, generating instructions in response to the test control signal to control the boundary testing means and the internal testing means.

14. The arrangement of claim 11, wherein the interface includes a state machine.

15. The arrangement of claim 10, wherein multiple system clock signals are interrupted and replaced by the test clock at a location external to the integrated circuit.

* * * * *